United States Patent [19]

Fujii et al.

[11] Patent Number: 5,476,811
[45] Date of Patent: Dec. 19, 1995

[54] METHOD OF GROWING EPITAXIAL LAYERS

[75] Inventors: Toshio Fujii, Atsugi; Adarsh Sandhu, Yokohama, both of Japan

[73] Assignee: Fujitsu Limited, Kawasaki, Japan

[21] Appl. No.: 409,944

[22] Filed: Mar. 23, 1995

Related U.S. Application Data

[63] Continuation of Ser. No. 262,356, Jun. 20, 1994, abandoned, and a continuation of Ser. No. 442,907, Nov. 28, 1989, abandoned.

[30] Foreign Application Priority Data

Nov. 28, 1988 [JP] Japan .................................. 63-301255
Nov. 28, 1988 [JP] Japan .................................. 63-301256
Nov. 28, 1988 [JP] Japan .................................. 63-301257

[51] Int. Cl.$^6$ .................................................. C36B 23/68
[52] U.S. Cl. .............................. 432/105; 117/86; 117/89; 117/92; 117/108
[58] Field of Search ........................ 117/86, 85, 89, 117/88, 92, 102, 108, 104; 437/105

[56] References Cited

U.S. PATENT DOCUMENTS

| | | | |
|---|---|---|---|
| 4,613,387 | 9/1986 | Turley | 437/119 |
| 4,636,268 | 1/1987 | Tsang | 156/612 |
| 4,785,457 | 11/1988 | Asbeck et al. | 372/46 |
| 4,797,374 | 1/1989 | Scott et al. | 437/129 |
| 4,805,179 | 2/1989 | Harder et al. | 372/47 |
| 4,839,307 | 6/1989 | Imanaka et al. | 437/129 |

FOREIGN PATENT DOCUMENTS

| | | |
|---|---|---|
| 0261262 | 3/1988 | European Pat. Off. . |
| 87/00694 | 1/1987 | United Kingdom . |

OTHER PUBLICATIONS

Horiguchi et al., "Molecular Beam Epitaxial Growth of GaAs Using Triethylgallium and Arsine,"Jap. *J. of Appl. Phys.*, vol. 25, No. 12, Dec. 1986, pp. L979–L982.

Kobayashi et al., "Improved 2DEG Mobility in Selectively Doped GaAs/IN–AlGaAs Grown by MOCVD Using Triethyl Organometallic Compounds," *Electron. Lett.*, vol. 20, No. 21, Oct, 11, 1984, pp. 887–888.

Miller, "Lateral p–n junction formation in GaAs molecular beam epitaxy by crystal plane dependent doping," *Appl. Phys. Lett.*, vol. 47, No. 12, Dec. 15, 1985, pp. 1309–1311.

Tamamura et al., "Carbon Incorporation in Metalorganic Chemical Vapor Deposition (Al,Ga)As Films Grown on (100), (311)A, and (311)B Oriented GaAs Substrates", *Appl. Phys. Lett.*, vol. 50, No. 17, Apr. 27, 1987, pp. 1149–1151.

Bose et al., "Influence of the Substrate Orientation on Si Incorporation in Molecular–Beam Epitaxial GaAs," *J. Appl. Phys., vol. 63, No. 3, Feb. 1, 1988, pp. 743–748*.

IBM Technical Disclosure Bulletin, vol. 31, No. 2, "Non–Absorbing Laser Mirrors," Jul. 2, 1988, p. 240.

*Primary Examiner*—Robert Kunemund
*Attorney, Agent, or Firm*—Staas & Halsey

[57] ABSTRACT

A method of growing a plurality of epitaxial layers each having a property which is different from each other simultaneously on a common substrate comprises steps of forming at least a first crystal surface and a second crystal surface which are crystallographically non-equivalent to each other on the substrate, introducing particles comprising constituent elements of the epitaxial layers into a region in the vicinity of the substrate, the particles including at least metal-organic molecules containing one of the elements constituting the epitaxial layers, decomposing the metal-organic molecules such that the layer constituting element therein is released as a result of the decomposition, and depositing the aforesaid particles including the element released by the decomposition of the metal-organic molecules on the first and second crystal surfaces so that a first epitaxial layer and a second epitaxial layer, respectively differing in properties from each other, are grown on respective the first and second crystal surfaces, the step of deposition being performed such that the growth of the first and second epitaxial layers is controlled by the decomposition of the metal-organic molecule.

20 Claims, 7 Drawing Sheets

METHOD OF GROWING EPITAXIAL LAYERS

This application is a continuation, of application number 08/262,356, filed Jun. 20, 1994, now abandoned, and a continuation of application Ser. No. 07/442,907 filed Nov. 28, 1989 now abandoned.

BACKGROUND OF THE INVENTION

The present invention generally relates to growth of epitaxial layers and more particularly to a method of growing a plurality of epitaxial layers having different properties on a common substrate in a continuous epitaxial process, suitable for manufacturing a semiconductor device such as a stripe-type laser diode or a so-called graded-index waveguide separate-confinement heterostructure (GRIN-SCH) laser diode in which an active layer is surrounded by clad layers.

Laser diodes are currently used extensively in various fields such as optical telecommunications, optical information storage and reproduction on and from optical recording media such as compact disks or laser disks, optical measurement of various quantities, control of various systems and the like.

In most of these applications, a so-called stripe-type laser diode is used currently in which light is confined in a stripe-shaped narrow active layer surrounded vertically and laterally by clad layers. By constructing the laser diode as such, efficient oscillation of the laser is realized as a result of confinement of light into such a narrow active region.

In order to confine the light in the active layer, it is necessary to form the clad layers having a low refractive index such that the clad layers surround the active layer. This means that the active layer is not only sandwiched by a pair of clad layers, one at the top and one at the bottom but has to be bounded also laterally by a pair of clad layers. Further, in order to improve the efficiency of carrier injection, it is desired that the electric current, or carriers, injected to the active layer is confined laterally such that the carriers are concentrated in a part of the clad layer in contact with the active layer. For this purpose, it is necessary to form the clad layer into regions having different conductive types.

Conventionally, formation of such clad layers laterally bounding the active layer cannot be made simultaneously with the formation of the active layer. Similarly, formation of a clad layer laterally divided into a plurality of regions having different conductive types cannot be made immediately before or after the formation of the active layer without interrupting the process of crystal growth. Thus, when forming a structure having an active layer surrounded vertically and laterally by clad layers in an epitaxial growing system for growing crystal layers epitaxially, such as a molecular beam epitaxial (MBE) crystal growth system, a partially completed laser diode is taken out from the system and is subjected to various processes such as mesa formation, insulator film deposition, ion implantation, impurity doping and diffusion, and so on. After these processes are completed, the laser diode is returned to the epitaxial growing system for further formation of epitaxial layers. As will be easily understood, the step of taking out the partially completed laser diode from the epitaxial growing system for performing additional processes is undesirable as such a step, and the other processes performed outside the epitaxial growing system, tend to introduce defects in the laser diode. Thereby, the yield of the product is decreased.

Meanwhile, there is a so-called GRIN-SCH laser diode having a thin active layer of gallium arsenide (GaAs) forming an isolated quantum well structure. In this laser diode, a pair of clad layers of gallium aluminium arsenide (GaAlAs) are provided so as to sandwich the active layer and the composition of the clad layer is graded such that the content of aluminium (Al) is low at a side of the clad layer in contact with the active layer while the content is increased gradually as the distance from the active layer is increased. As a result of such a construction, the decrease of the optical confinement factor, indicative of the efficiency of confinement of light in the active layer, is prevented and associated therewith, the construction of a laser diode having a low threshold current density becomes possible.

Conventionally, such a graded clad layer used in the GRIN-SCH laser diode has been formed by changing the flow rate of a source gas of Al with respect to that of gallium (Ga) together with the progress of crystal growth of the clad layer when the clad layer is grown by a metal-organic chemical vapor deposition (MOCVD) technique. When the clad layer is grown by MBE, on the other hand, the temperature of a cell for holding a source material of Al and the temperature of a cell for holding a source material of Ga are changed such that a desired compositional profile is obtained.

In the presently available technique of MOCVD or MBE, however, there is a problem in that, although these techniques provide a satisfactory control of the Al content as long as the composition is constant throughout the clad layer, accurate control of the flow rate of the source gases or the temperature of the source materials, to a degree sufficient to provide a satisfactory compositional profile, is extremely difficult as such a control of the growth is indirect and not performed directly at the substrate where the growth is made.

SUMMARY OF THE INVENTION

Accordingly, it is a general object of the present invention to provide a novel and useful method of manufacturing a semiconductor device wherein the aforementioned problems are eliminated.

Another and more specific object of the present invention is to provide a method of growing epitaxial crystal layers wherein a plurality of epitaxial crystal layers different from each other are grown on a common substrate simultaneously.

Another object of the present invention is to provide a method of growing epitaxial crystal layers wherein a plurality of epitaxial crystal layers having different conduction types are grown on a common substrate simultaneously.

Another object of the present invention is to provide a method of manufacturing a laser diode having an active layer surrounded laterally and vertically by clad layers wherein the laser diode can be produced in an epitaxial growth system without taking the laser diode out of the system during the process of manufacturing.

Another object of the present invention is to provide a method of manufacturing a semiconductor device having a graded layer wherein the compositional profile of the graded layer is controlled accurately during the growth of the layer.

Another object of the present invention is to provide a method of manufacturing a laser diode having a GRIN-SCH structure, comprising an active layer of GaAs sandwiched by a pair of graded layers having a composition of $Al_xGa_{1-x}As$, wherein the content of Al is changed gradually through the graded layers in accordance with an accurately controlled compositional profile.

Another object of the present invention is to provide a method of growing epitaxial crystal layers comprising the steps of preparing a substrate having at least a first surface exposing a first crystal plane and a second surface exposing a second crystal plane which is different from the first crystal plane, releasing atoms forming the epitaxial crystal layers to be grown by decomposition of metal-organic molecules, and growing a first epitaxial layer and a second epitaxial layer simultaneously on said first surface and on said second surface by depositing the atoms. According to the present invention, different epitaxial layers can be grown on the substrate simultaneously by exposing different crystal planes at the surface of the substrate.

Another object of the present invention is to provide a method of growing epitaxial crystal layers having different conduction types by the steps of preparing a substrate having at least a first surface portion at which a first crystal plane is exposed and a second surface portion at which a second crystal plane different from the first crystal plane is exposed releasing atoms forming the epitaxial crystal layers to be grown by decomposition of metal-organic molecules, and growing a first epitaxial layer and a second epitaxial layer simultaneously on said first surface portion and on said second surface portion by depositing the atoms thus released, wherein the conduction type of the first and second epitaxial layers are made different by controlling the vapor pressure of a constituent element of the epitaxial layers at a predetermined value when the element is supplied in a form of the atoms. According to the present invention, the conduction type of various epitaxial layers grown simultaneously on the substrate can be controlled easily by controlling the vapor pressure of the foregoing constituent element.

Another object of the present invention is to provide a method of manufacturing a stripe-type laser diode comprising an active layer vertically bounded by first and second clad layers and laterally bounded by third and fourth clad layers, comprising the steps of processing a GaAs substrate defined by a (100) surface such that the substrate is further defined with a stripe-shaped surface portion exposing a selected one of a (311)A plane and a (311)B plane at a part of the (100) surface, growing the first clad layer having a composition $Al_xGa_{1-x}As$ with a compositional parameter x set at a first value x1 on the substrate by performing a metal-organic molecular beam epitaxy for depositing at least Al and Ga at a first predetermined temperature, growing the active layer having a composition $Al_xGa_{1-x}As$ with a compositional parameter x set at a second value x2 smaller than the foregoing first value x1 on a part of the first clad layer covering said stripe-shaped surface portion and simultaneously growing the third and fourth clad layers both having the composition $Al_xGa_{1-x}As$ with a compositional parameter x set at a third value x3 larger than the foregoing second value x2 on the first clad layer, laterally and respectively on both opposite sides of the active layer by performing the foregoing metal-organic molecular beam epitaxy at a second predetermined temperature, and growing the second clad layer having a composition $Al_xGa_{1-x}As$ with the compositional parameter x set at said first value x1 on said active layer and further on said third and fourth clad layers by performing the foregoing metal-organic molecular beam epitaxy at said first predetermined temperature. According to the present invention, the laser diode, having the active layer surrounded laterally and vertically by said first through fourth clad layers, can be manufactured in a metal-organic molecular beam epitaxial growth system without taking out the laser diode from the system during the step of manufacturing.

Another object of the present invention is to provide a method of manufacturing a stripe-type laser diode comprising an active layer vertically bounded by first and second clad layers and laterally bounded by third and fourth clad layers, comprising steps of processing a GaAs substrate defined by a (100) surface such that the substrate is further defined with a stripe-shaped surface portion exposing a selected one of a (311)A plane and a (311)B plane at a part of the (100) surface, growing a first buffer layer of p-type GaAs on said stripe-shaped surface portion of the substrate and simultaneously growing second and third buffer layers of n-type GaAs on the substrate at both sides on the first buffer layer by performing a metal-organic molecular beam epitaxy for depositing at least Ga, As and an n-type dopant while setting a vapor pressure of As at a first predetermined level, growing the first clad layer comprising a first portion comprised of p-type GaAlAs and second and third portions comprised of n-type GaAlAs, each of the portions having a composition $Al_xGa_{1-x}As$ with a compositional parameter x at a first value x1 such that the first portion of the first clad layer is grown on the first buffer layer and the second and third portions are grown on the second and third buffer layers by performing a metal-organic molecular beam epitaxy for depositing Al, Ga, As and the an n-type dopant while setting the vapor pressure of As to the first predetermined level, growing the active layer of p-type GaAlAs having a composition $Al_xGa_{1-x}As$ with a compositional parameter x at a second value x2 smaller than the foregoing first value x1 and simultaneously growing the second and third clad layers of p-type GaAlAs both having the composition $Al_xGa_{1-x}As$ with a compositional parameter x at a third value x3 larger than the foregoing second value x2 by the second metal-organic molecular beam epitaxy such that the active layer is grown on the first portion of the first clad layer and such that the third and fourth clad layers are grown on the second and third portions of the first clad layer respectively, and growing the second clad layer of n-type GaAlAs having the composition $Al_xGa_{1-x}As$ with the compositional parameter x at said first value x1 on said active layer and on said third and fourth clad layers by performing the foregoing metal-organic molecular beam epitaxy for depositing at least Ga, Al, As and the n-type dopant while setting the vapor pressure of As to a second predetermined level. According to the present invention, the laser diode has a structure which confines the current to the active layer. This laser diode can be manufactured without removing it from the apparatus used for growing crystal layers during the step of manufacturing.

Another object of the present invention is to provide a method of controlling the composition of a GaAlAs layer, grown on a GaAs substrate having either an exposed (311)A surface or an exposed (311)B surface by a metal-organic molecular beam epitaxy depositing at least Al and Ga, comprising a step of controlling the temperature of the GaAs substrate.

Another object of the present invention is to provide a method of manufacturing a semiconductor device comprising an active layer sandwiched by first and second graded layers of GaAlAs, comprising steps of preparing a GaAs substrate having either an exposed (311)A surface or an exposed (311)B surface, growing the first graded layer of GaAlAs having a composition $Al_xGa_{1-x}As$ with a compositional parameter x for Al on the substrate by a metal-organic molecular beam epitaxy while changing the temperature of the substrate such that the compositional parameter x is decreased with the growth of the first graded layer, growing the active layer on the first graded layer, and growing the second graded layer on the active layer by the foregoing metal-organic molecular beam epitaxy such that the compositional parameter is increased with the growth of the second graded layer. According to the present invention, a desired compositional profile is obtained for the graded layers by simply controlling the temperature of the GaAs substrate.

Other objects and further features of the present invention will become apparent from the following detailed description of preferred embodiments when read in conjunction with attached drawings.

DETAILED DESCRIPTION

Figure 1:
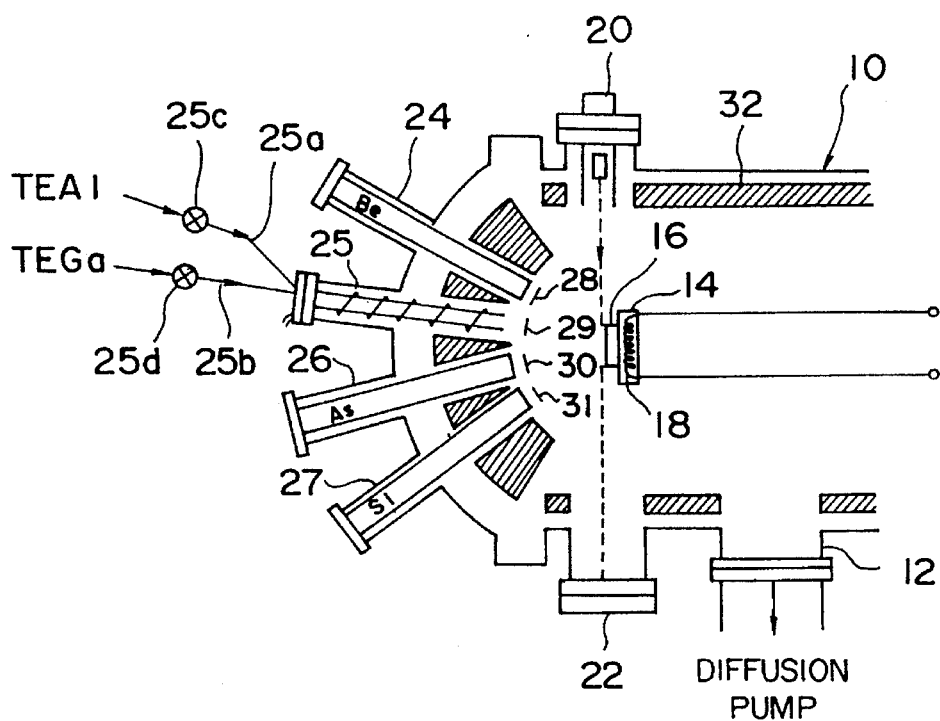
FIG. 1 is a schematical view of a metal-organic molecular beam epitaxial crystal growth system used in the present invention.

FIG. 1 shows a MBE crystal growth system employed in the present invention for growing crystal layers. Referring to the drawing, the system comprises a reaction chamber 10 which is evacuated by a diffusion pump (not illustrated) through an exhaust conduit 12. In the reaction chamber 10, there is provided a holder 14 of molybdenum, a GaAs substrate 16, on which the growth of epitaxial layers is to be made, is held on the holder 14. The holder 14 is embedded with a heater 18 and the temperature of the substrate 16 is controlled by controlling electrical current flowing through the heater 18. Further, a reflection high energy electron diffraction (RHEED) gun 20 and a corresponding RHEED screen 22 are provided in the chamber 10, respectively in an upper part and a lower part, for monitoring the state of crystal layers grown on the substrate 16.

In order to introduce elements to be deposited on the substrate for epitaxial growth, the chamber 10 is provided with cells 24, 25, 26 and 27 wherein the first cell 24 accommodates a solid mass of beryllium acting as a source of Be, a p-type dopant, and the third cell 26 accommodates a solid mass of arsenic which is used as the source of As. Further, a pipe 25a for introducing triethylaluminium (TEAl), a gaseous source material of Al, and a pipe 25b for introducing triethylgallium (TEGa), a gaseous source material of Ga, are provided in the second cell 25. The amounts of TEAl and TEGa in the reaction chamber 10 are adjusted by valves 25c and 25d respectively connected to the pipes 25a and 25b. Further, in the fourth cell 27, a solid mass of silicon (Si) is accommodated as a source of Si which acts usually as an n-type dopant. Further, the cells 24 through 26 are provided with respective shutters 28 through 31 for controlling the supply of the associated source materials or elements into the reaction chamber 10.

Further, the inner surface of the reaction chamber 10 is covered with a liquid nitrogen shroud 32 except for the exhaust conduit 12, the RHEED gun 20, the RHEED screen 22, and the cells 24 through 27.

Using the crystal growth system of FIG. 1, the applicants of the present invention have conducted a research for growing GaAlAs epitaxial layers having a composition $Al_xGa_{1-x}As$ on the GaAs substrate 16 with interesting results as will be described with reference to FIG. 2.

First, the experiments conducted in the research will be described. In this experiment, a GaAs substrate having a (100) surface and two other GaAs substrates, one having a (311)A surface and one having a (311)B surface, were prepared. Each of the substrates was held on the holder 14 of the system of FIG. 1 as the substrate 16 and heated to a predetermined temperature by the heater 18. While heating, the shutters 29 and 30 were opened and the valves 25c and 25d were opened together. Responsive thereto, an epitaxial layer of GaAlAs having a composition of $Al_xGa_{1-x}As$ was grown on the substrate 16. FIG. 2 shows the compositional parameter x representing the content of Al as a function of the temperature used for growing the GaAlAs layer. Note that the growth was made with the vapor pressure of As set to $1.7 \times 10^{-5}$ Torr.

Figure 2:
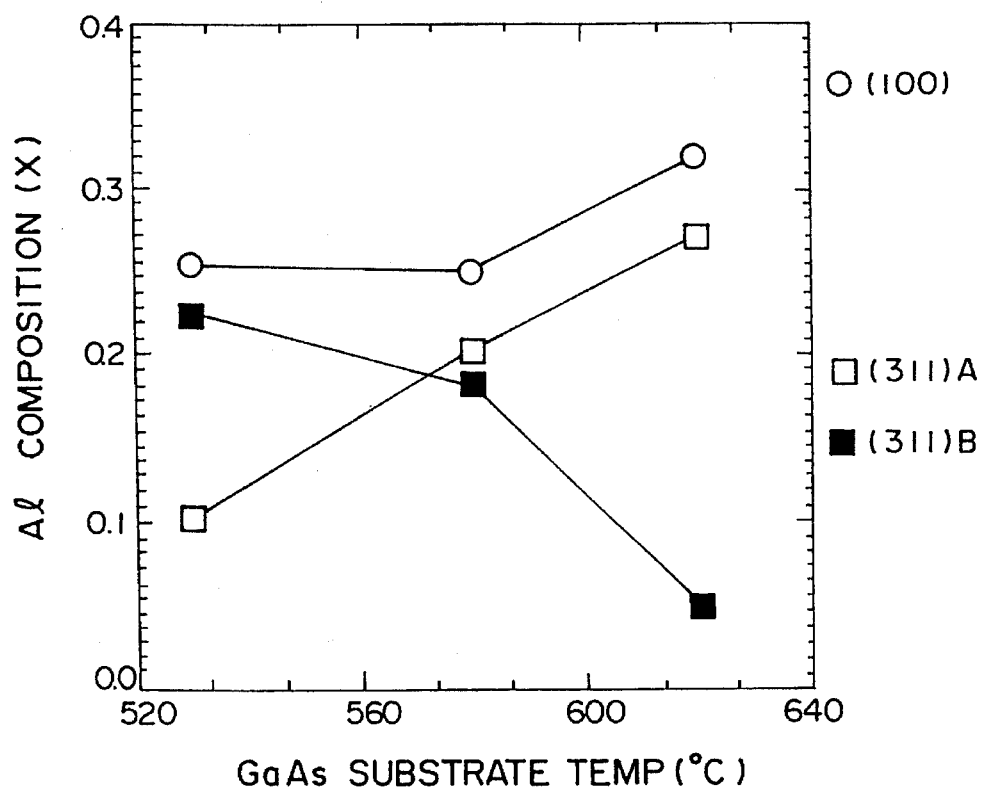
FIG. 2 is a graph showing the compositional change of an epitaxial layer grown by the system of FIG. 1 on various crystal surfaces of a GaAs crystal while changing the temperature of growth.

FIG. 2 shows the result of the experiment for each of the crystal surfaces (100), (311)A and (311)B. As can be seen in the drawing, the compositional parameter x of Al does not change significantly with the temperature of growth when the epitaxial layer is grown on the (100) surface of the substrate. On the other hand, when the epitaxial layer is grown on the (311)A surface, there appears a strong correlation between the compositional parameter x and the temperature of growth such that the compositional parameter x increases from about 0.1 to about 0.27 responsive to the increase of the temperature of growth from about 520° C. to about 630° C. Further, when the epitaxial layer is grown on the (311)B surface, the compositional parameter x decreases from about 0.22 to 0.05 responsive to the temperature increase from about 520° C. to about 630° C.

The result of FIG. 2 suggests that, by suitably controlling the temperature of growth during the epitaxial growth of GaAlAs layer on the (311)A or (311)B surface of a GaAs substrate, one can construct a semiconductor device having a graded layer of GaAlAs with a desired compositional profile.

Next, a first embodiment of the present invention will be described for a GRIN-SCH laser diode in which the foregoing discovery is applied.

Figure 3:
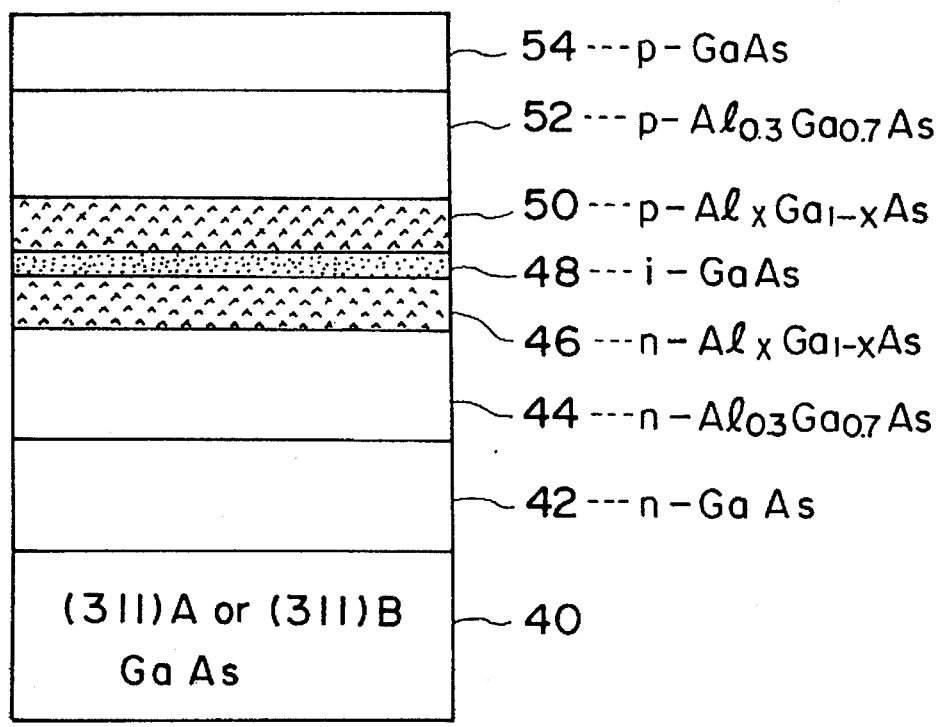
FIG. 3 is a cross sectional view of a laser diode manufactured according to a first embodiment of the present invention.

FIG. 3 shows a cross sectional view of the GRIN-SCH laser diode manufactured according to the present embodiment. Referring to FIG. 3, the laser diode is formed first by holding a GaAs substrate 40 on the holder 14 of the system of FIG. 1 and heating the substrate to 630° C. In this embodiment, the GaAs substrate 40 exposes the (311)A surface. Next, the shutters 29 through 31 are opened and at the same time the valve 25d is opened. Responsive thereto, Ga and As are supplied into the reaction chamber together with Si acting as the n-type dopant and an n-type GaAs buffer layer 42 is grown on the substrate epitaxially, to a thickness of about 3 µm. Further, the valve 25c for introducing TEA is opened and an n-type clad layer 44 of $Al_{0.3}Ga_{0.7}As$ is formed on the buffer layer 42 at the same temperature, to a thickness of about 1.3 µm.

Figure 5:
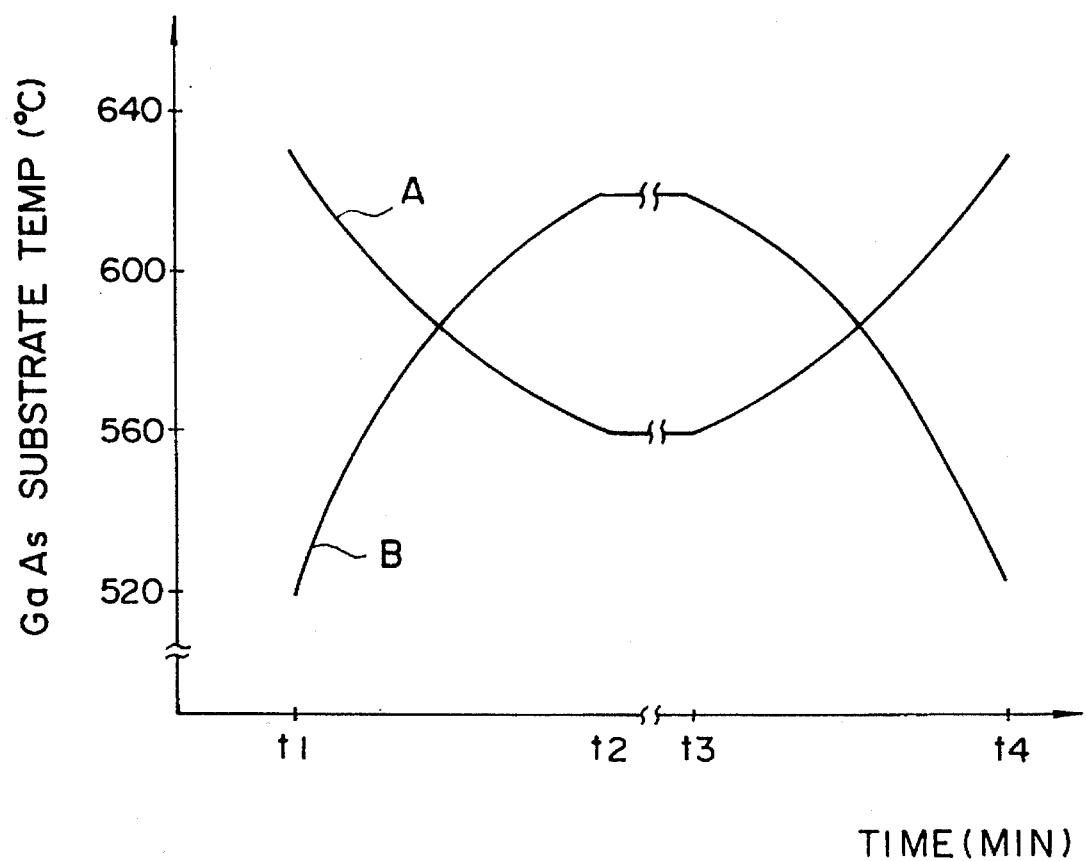
FIG. 5 is a graph showing a temperature curve employed in the system of FIG. 1 for realizing the compositional profile of FIG. 4 for the laser diode of FIG. 3.

After the formation of the clad layer 44, the temperature of the substrate 40 is controlled according to a curve A shown in FIG. 5 for a time interval ranging from an instance t1 to an instance t2 while continuing the epitaxial growth. Note that FIG. 5 shows a temperature profile used for the epitaxial growth of the graded layers in the laser diode, Thus, at the first instance t1, the temperature of the substrate 40 is set to 630° C. and the temperature is gradually lowered according to the curve A as the growth proceeds until the instance t2 is reached at which the temperature is set to 560° C. By choosing the time scale between the instance t1 and the instance t2 to 40 minutes, a graded layer 46 of n-type $Al_xGa_{1-x}As$ is grown, to a thickness of 0.2 µm with a compositional profile in which the parameter x changes gradually from 0.30 to 0.18.

After the graded layer 46 is grown, the shutter 31 and the valve 25c are closed. As a result, a thin undoped GaAs active layer 48 is grown on the graded layer 46, to a thickness of about 3 to 10 nm. The temperature for the growth of the active layer may be different from the foregoing temperature of 560° C.

Next, the valve 25c is opened again and the shutter 28 is opened for introducing the P-type dopant, Be. Further, while gradually increasing the temperature from 560° C. to 630° C. along the curve A from an instance t3 to an instance t4, a p-type graded layer 50 of AlGaAs having the composition $Al_xGa_{1-x}As$ with a reversed compositional profile to that of the graded layer 46 is grown on the p-type GaAs active layer 48 for, to a thickness of about 0.2 µm. Note that the time interval between the instance t3 and the instance t4 is identical to that between the instance t1 and the instance t2 and thus, the temperature curve used for growing the graded layer 50 is the reversal of the part of the curve A between the instance t1 and the instance t2.

Further, the growth of another clad layer 52 of p-type GaAlAs with a composition of $Al_{0.3}Ga_{0.7}As$ is performed on the layer 50 while maintaining the temperature of the substrate 40 at 630° C., to a thickness of about 1.3 µm. Further, the valve 25c is closed and a p-type GaAs layer 54 is grown on the p-type layer 52, to a thickness of about 3 µm and the GRIN-SCH laser diode is completed.

Figure 4:
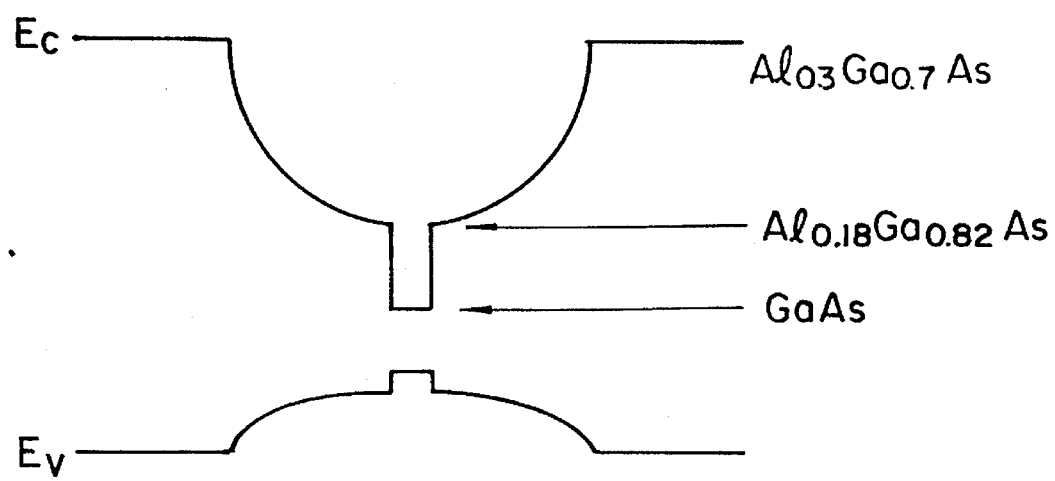
FIG. 4 is a diagram showing a compositional profile of the laser diode of FIG. 3.

FIG. 4 shows the energy band structure of the GRIN-SCH laser diode manufactured as described. As can be seen from the drawing, the energy gap between the conduction band Ec and the valence band Ev is changed gradually in correspondence to the gradual compositional change of the graded layers 44 and 52. Together with the gradual change of the band structure as such, the refractive index is also changed gradually and an effective confinement of photons as well as carriers in the active layer is achieved.

The foregoing procedure is applicable similarly to the case when the GaAs substrate 40 has an exposed (311)B surface and the growth of the epitaxial layers is made on this (311)B surface, except that the temperature curve used for growing the graded layers 46 and 50 is not the curve A but instead the curve B also shown in FIG. 5 is used. Thus, at the first instance t1, the temperature of the substrate 40 is set to 520° C. and the temperature is gradually increased with the growth of the layer 46 to 620°, starting from the instance t1. Responsive to the epitaxial growth made as such, to a thickness of about 0.2 µm, the compositional parameter x of the graded layer 46 is changed gradually from 0.23 to 0.05. When growing the graded layer 50 on the active layer 48, on the other hand, the temperature of the substrate 40 or the temperature of the epitaxial growth is decreased along the curve B from 620°60 C. at the instance t3 to 520° C. at the instance t4. Responsive to the growth, a compositional profile ranging from 0.05 to 0.23 is obtained for the graded layer 50.

As described heretofore, the present invention enables accurate control of the compositional profile of the epitaxial layer by controlling the temperature of the substrate. Note that the temperature of the substrate can be controlled accurately by controlling the current flowing through the heater 18.

Next, a second embodiment of the present invention will be described. According to the second embodiment, the (100) surface of a GaAs substrate is grooved by etching such that a (311)A surface or a (311)B surface of GaAs crystal is exposed additionally to the (100) surface, and an epitaxial growth of GaAlAs layers having different compositions is made simultaneously on the various crystal surfaces.

Figure 6:
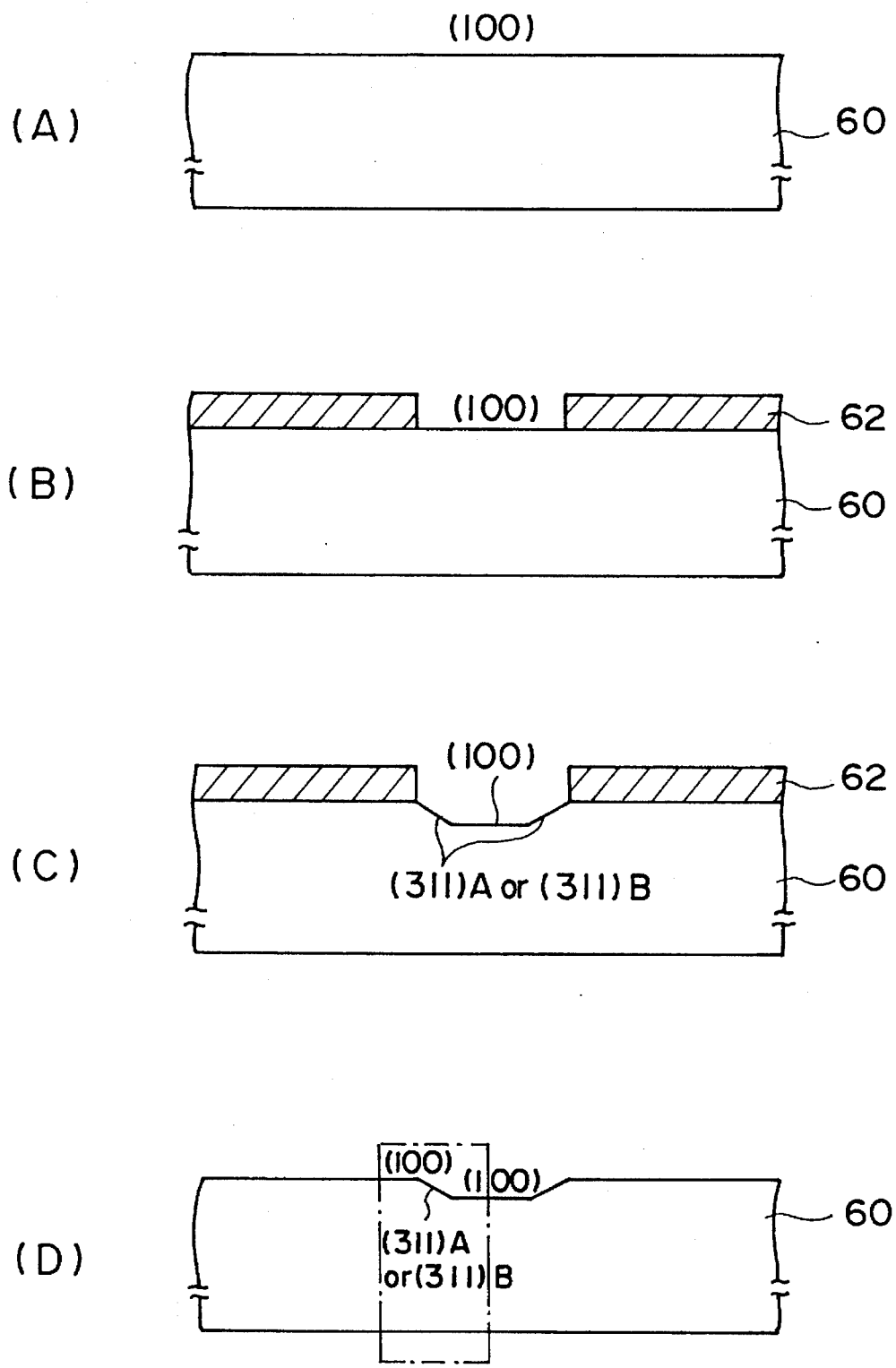
FIG. 6, which has subports (A)–(D) which are diagrams showing steps of exposing a crystal surface such as (311)A or (311)B on a part of a major surface of a GaAs substrate which is defined by the (100) crystal plane.

FIGS. 6(A) through (D) show a series of steps for exposing the (311)A surface or the (311)B surface by etching. Referring to the drawing, a GaAs substrate 60 defined by the (100) surface is prepared in a step of FIG. 6(A), and the substrate 60 thus prepared is covered entirely with a mask layer 62 which may comprise silicon oxide or silicon nitride. Next, the mask layer 62 is patterned such that a part of the layer 62, corresponding to the region in which a groove exposing the (311)A or (311)B surface is to be formed, is removed photolithographically. As a result, a structure shown in FIG. 6(B) is obtained. Further, the structure of FIG. 6(B) is subjected to anisotropic etching using a mixture of a phosphoric acid ($H_3PO_4$), hydrogen peroxide ($H_2O_2$) and water ($H_2O$) with a mixing ratio of 50: 1: 50. The foregoing mixture acts anisotropically on the exposed (100) surface and as a result, a structure shown in FIG. 6(C), in which a groove exposing the (311)A or the (311)B surface is formed, is obtained as shown in FIG. 6. After the surface (311)A or (311)B is exposed, the mask layer 62 is removed and the substrate 60 as shown in FIG. 6(D) is obtained.

The substrate 60 thus obtained is brought into the metalorganic molecular beam epitaxial crystal growth system of FIG. 1 as the substrate 16, and the deposition of GaAlAs is made similarly to the first embodiment. Thereby, the composition of the GaAlAs layers grown on the (100) surface and the composition of that grown on the (311)A or (311)B surface become different because of the reason already described with reference to FIG. 2.

Thus, when the substrate 60 has the (100) surface and the (311)A surface exposed, a GaAlAs crystal layer having a composition of $Al_{0.25}Ga_{0.75}As$ is grown on the (100) surface of the substrate while a GaAlAs crystal layer having a composition of $Al_{0.1}Ga_{0.9}As$ is grown on the (311)A surface by setting the temperature of the substrate at 520° C. When the substrate 60 has the (311)B surface in addition to the (100) surface exposed, on the other hand, a GaAlAs crystal layer having a composition of $Al_{0.32}Ga_{0.68}As$ is grown on the (100) surface and a GaAlAs crystal layer having a composition of $Al_{0.05}Ga_{0.95}As$ is grown on the (311)B surface simultaneously provided that the temperature of the substrate 60 is set to 630° C.

Next, a method of manufacturing a stripe-type layer diode using the foregoing method of epitaxial growth will be described with reference to FIG. 7.

First, a GaAs substrate 70 defined with an exposed (100) surface is subjected to anisotropic etching similarly to the processes described with reference to FIGS. 6(A)–(D) such that the (311)A or (311)B surface is exposed along a stripe-like portion extending on the (100) surface. Hereinafter, a description will be given for a case in which it is the (311)B surface that is exposed along the stripe-like portion on the (100) surface of the substrate 70.

The substrate 70 prepared as such is first brought into the epitaxial growth system of FIG. 1 where the substrate 70 is held on the holder 14 similarly to the substrate 16. Next, the heater 18 is energized such that the temperature of the substrate 70 is maintained at 520° C. and the shutters 29 through 31 are opened. Simultaneously, the valve 25d is opened and a buffer layer 72 of $n^+$-type GaAs is grown epitaxially on the substrate 70, to a thickness of about 2 μm. In the buffer layer 72, the impurity concentration level is controlled to about $2\times10^{18}$ cm$^{-3}$. Note that the buffer layer 72 thus grown on the substrate 70 exposes a (100) top surface and a (311)B top surface in correspondence to the substrate 70.

Next, the temperature of the substrate 70 is maintained at 520° C. and the valve 25c is opened additionally. As a result, a clad layer 74 of n-type GaAlAs is grown on the buffer layer 72 for about 1.5 μm. As the temperature of the substrate is set to 520° C., the composition of the GaAlAs layer 74 is not substantially different between a part of the layer 74 grown on the (100) surface and a part grown on the (311)B surface (see FIG. 2). Thus, the composition of the layer 74 is uniform and particularly is a composition of about $Al_{0.25}Ga_{0.75}As$. The impurity concentration level of the layer 74 is about $3\times10^{17} cm^{-3}$ As the layer 74 is grown epitaxially, the layer 74 is defined by a (100) top surface corresponding to the (100) top surface of the buffer layer 72 and by a (311)B top surface corresponding to the (311)B top surface of the buffer 72.

Next, the temperature of the substrate 70 is increased to about 630° C. by increasing the current flowing through the heater 18. When the temperature has reached to 630° C. the shutter 31 is closed and an epitaxial layer 76 of p-type GaAlAs is grown on the clad layer 74, to a thickness of about 0.1 μm. As the temperature is set to 630° C., the composition of the epitaxial layer 76 is different between a part 76a covering the (100) top surface and a part 76b covering the (311)B top surface of the clad layer 74 (see FIG. 2). Thus, the part 76a formed on the (100) surface of the clad layer 74 has a composition $Al_{0.32}Ga_{0.68}As$ while the part 76b formed on the (311)B surface of the clad layer 74 has a composition $Al_{0.05}Ga_{0.95}As$. As the part 76a, having an increased Al content as compared to the part 76b, has a reduced refractive index as compared to the part 76b, the part 76a acts as the optical confinement layer for confining optical radiation in the part 76b which in turn acts as the active layer. Note that the active layer 76b has a limited width and extends along the stripe-like (311)B surface defined on the substrate 70. Thus, a structure in which the active layer 76b is bounded laterally by a pair of optical confinement layers 76a is obtained by a single step of growing the layer 76.

Next, the temperature of the substrate 70 is reduced to the foregoing temperature of 520° C. and a p-type GaAlAs layer 78 is grown on the epitaxial layer 76 with a composition $Al_{0.25}Ga_{0.75}As$. Note that there appears no substantial difference in the composition between a part of the layer 78 covering the optical confinement layer 76a and a part of the layer 78 covering the active layer 76b, as the growth of the layer 78 is made at 520° C. The layer 78 is grown to a thickness of about 1.5 μm with an impurity concentration level of about $5\times10^{19}$ cm$^{-3}$.

Next, the valve 25c is closed while maintaining the temperature of the GaAs substrate 70 at 520° C. and a $p^+$-type GaAs layer 80 having the impurity concentration level of about $1\times10^{19}$ cm$^{-3}$ is grown on the layer 78 to a thickness of about 0.5 μm. Thus, the laser diode in which the active layer 76a is surrounded vertically and laterally by clad layers 74, 78 and 76a is obtained.

The laser diode thus obtained has an advantage in that the light is effectively confined in the active layer which is surrounded vertically and laterally by the clad layers and the efficiency of oscillation is increased. The particularly important feature of the present invention is that the laser diode having such an advantageous feature is manufactured without taking the partially completed laser diode out of the epitaxial crystal growth system of FIG. 1 during the step of manufacturing.

When constructing the stripe-type laser diode on the substrate 70 in which the (311)A surface is exposed instead of the (311)B surface, basically an identical process is applicable except for the control of the temperature of the substrate 70. Thus, the growth of the layers 72, 74, 78 and 80 is made at 630° C. while the growth of the p-type epitaxial layer 76 is made at 520° C. As will be understood from FIG. 2, the n-type GaAlAs clad layer 74 and the p-type GaAlAs clad layer 78 thus grown are homogeneous and the composition is represented as $Al_{0.3}Ga_{0.7}As$ irrespective of whether the layer is grown on the (100) surface or on the (311)A surface while the p-type epitaxial layer 76 grown on the clad layer 74 is heterogeneous such that the first part 76a thereof on the (100) surface of the underlying clad layer 74 takes the composition $Al_{0.1}Ga_{0.9}As$ and the second part 76b on the (311)A surface of the layer 74 takes the composition $Al_{0.05}Ga_{0.95}As$ similarly to the foregoing embodiment. Thus, the second part 76b acts as the active layer and the first part 76a acts as the optical confinement layer or clad layer. In other words, the laser diode having exactly an identical structure to the foregoing embodiment is obtained.

Next, a third embodiment of the present invention will be described together with result of a research conducted by the applicants for growing an epitaxial layer of GaAs doped with Si on various crystal surfaces of GaAs substrate while changing the vapor pressure of As. In the present research, substrates exposing the (100) surface, (110) surface, (111)A surface, (111)B surface, (311)A surface and the (311)B surface were used.

In the experiments, each of these substrates was held on the holder 14 of the crystal growth system of FIG. 1 as the substrate 16 and the shutters 29, 30 and 31 were opened. At the same time, the valve 25a was opened and the cells 26 and 27 were heated. As a result, an epitaxial layer of GaAs was grown on the substrate 16. During the growth, the temperature of the substrate 16 was held at 580° C. and the flow rate of TEG was fixed constant.

Figure 8:
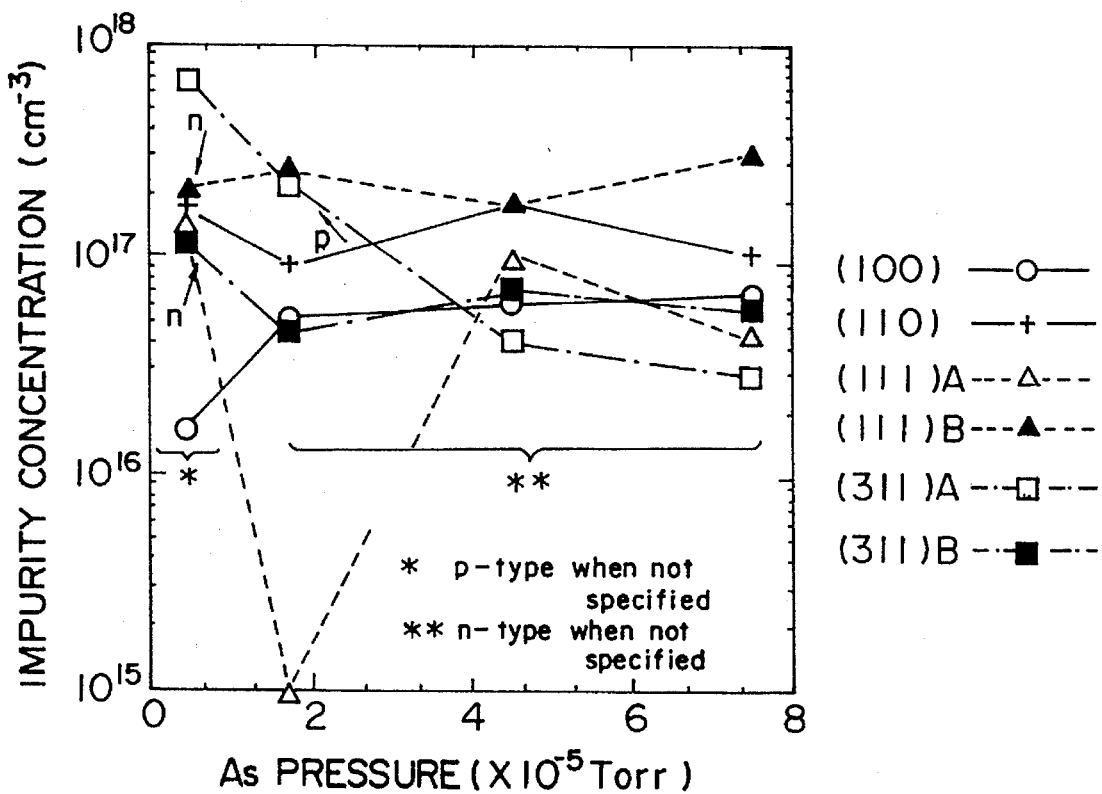
FIG. 8 is a graph showing the relationships between the impurity concentration level and the vapor pressure of As in various corresponding surfaces of an epitaxial layer grown on a substrate having various, exposed crystal surfaces.

FIG. 8 shows a relation between the impurity concentration level of the epitaxial layer thus grown on the substrate and the As vapor pressure employed for the growth. In FIG. 8, the epitaxial layers grown on different crystal surfaces are distinguished by changing the symbols and the conduction type of the obtained epitaxial layer is also represented. As will be apparent from FIG. 8, the conduction type of the epitaxial layer is changed by the vapor pressure of As employed at the time of growth of the epitaxial layers. Such a change of the conduction type occurs as a result of Si entering into the site of Ga or into the site of As. Thus, when Si enters into the site of Ga, Si is charged negatively and acts as the donor while when Si enters into the site of As, Si is charged positively and acts as the acceptor.

Figure 9:
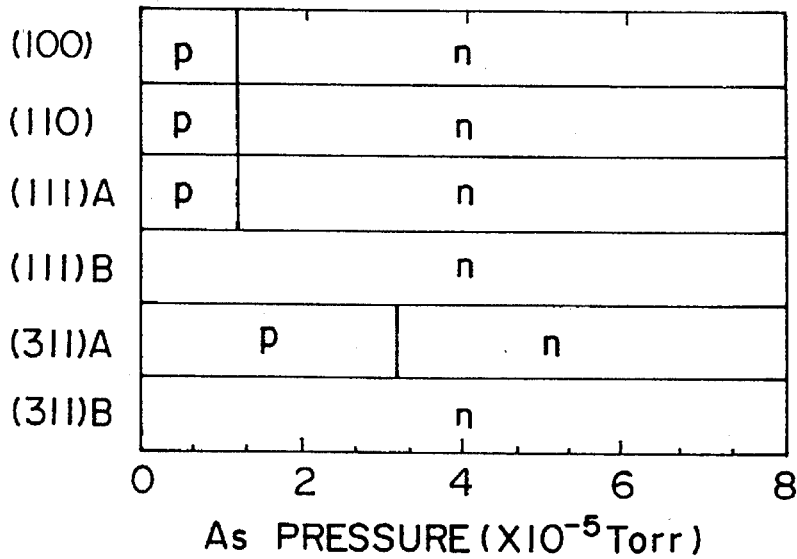
FIG. 9 is a diagram summarizing the relationships of FIG. 8 and showing a relation between the conduction type and As vapor pressure on various crystal surfaces of the substrate.

FIG. 9 summarizes the result of FIG. 8 in a form which may be easier for understanding. Similarly to FIG. 8, the relation shown in this drawing is for the case in which the growth is made at 580° C. As will be seen in FIG. 9, the epitaxial layer tends to exhibit the p-type conduction in a relatively low vapor pressure region of As while there is a tendency that the n-type appears when the vapor pressure of As is increased. The critical vapor pressure of As at which the transition between the p-type and the n-type occurs is changed depending on the crystal surface of the substrate on which the growth is made. Thus, the transition from the p-type to the n-type occurs at the As pressure of about $1 \times 10^{-5}$ Torr when the epitaxial layer is grown on the (100), (110) or (111)A surface while the transition occurs at about $3 \times 10^{-5}$ Torr when the epitaxial layer is grown on the (311)A surface. When the epitaxial layer is grown on the (111)B surface or on the (311)B surface, on the other hand, the conduction type remains the n-type throughout the foregoing vapor pressure range.

It is believed, further, that the change of the conduction type is not only dependent on the vapor pressure of As alone but is further dependent on the rate of supply of Ga. Thus, the conduction type of the epitaxial GaAs layer grown on the GaAs substrate is ultimately determined by a ratio of the arsenic vapor pressure and the rate of supply of Ga.

Using the foregoing discovery, it is possible to grow epitaxial layers having different conduction types on the same substrate by properly choosing the vapor pressure of As and by processing the substrate such that the substrate has various different exposed crystal surfaces. The processes to expose the (311)A or (311)B surface on the (100) surface of GaAs are already described with reference to FIGS. 6(A)–(D). Thus, one can grow a p-type epitaxial layer of GaAs on the (311)A surface and simultaneously an n-type epitaxial layer of GaAs on the (100), (110), (111)A, (111)B or (311)B surface of the substrate by setting the vapor pressure to about $1-2 \times 10^{-5}$ Torr. In this case, a high resistivity layer may be formed on the (111)A surface. When the arsenic vapor pressure is set lower than the foregoing level of about $1 \times 10^{-5}$ Torr, on the other hand, the p-type GaAs epitaxial layer is grown on the (100), (110), (111)A or (311)A surface and at the same time the n-type GaAs layer is grown on the (111)B or (311)B surface.

Further, by combining the result of FIG. 2 showing the compositional change of the epitaxial layer grown on a substrate as a function of the temperature of the substrate, it is possible to grow an epitaxial layer of GaAlAs having different compositions and different conduction types on a single GaAs substrate by controlling the temperature of the crystal growth and the vapor pressure of As.

Figure 10:
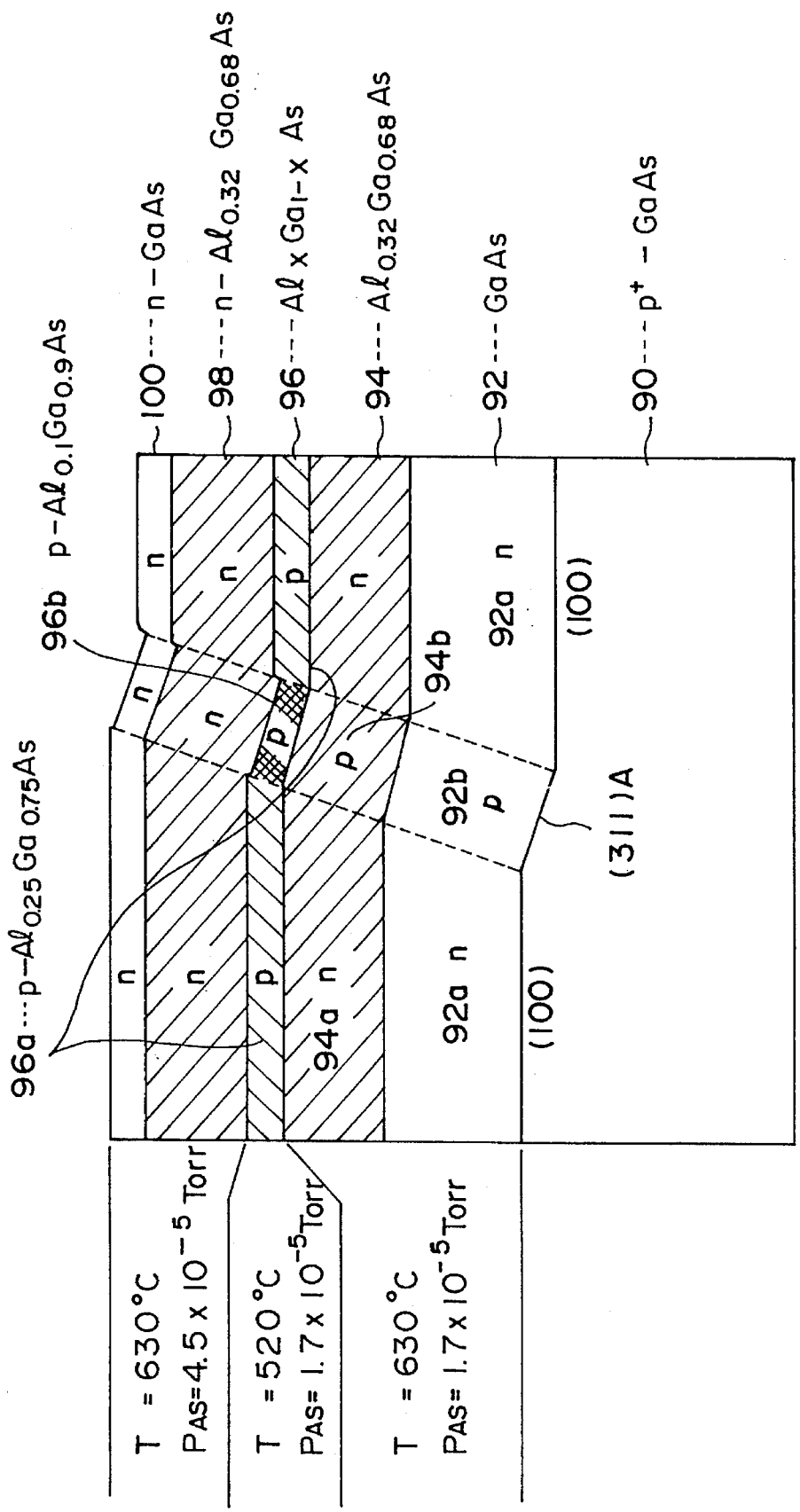
FIG. 10 is a cross sectional view of a laser diode according to the third embodiment of the present invention.

Next, the process of manufacturing a stripe-like laser diode in which the foregoing findings are employed will be described with reference to FIG. 10.

Figure 7:
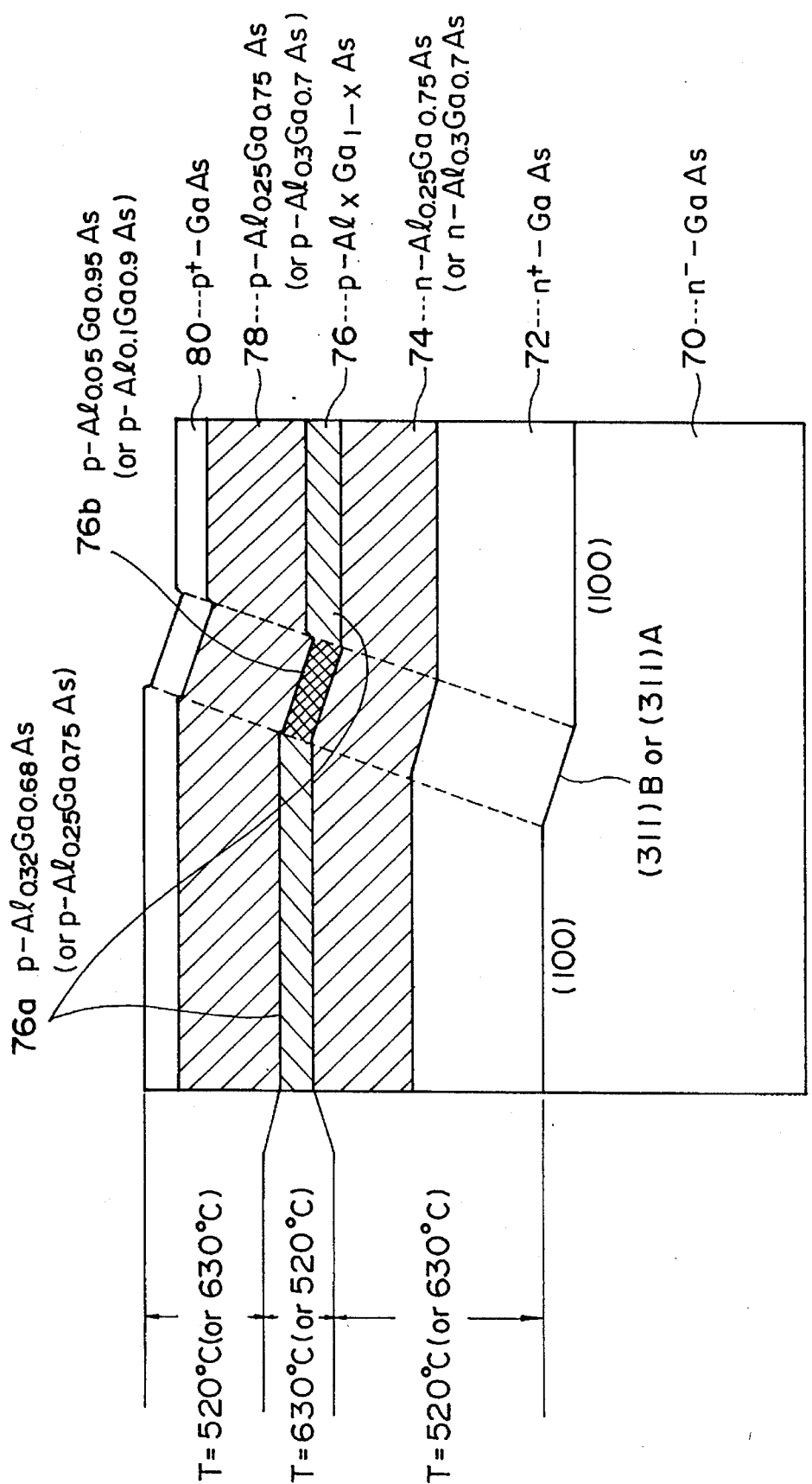
FIG. 7 is a cross sectional view of the structure of a laser diode manufactured according to a second embodiment of the present invention.

In a first step, a $p^+$-type substrate 90 is prepared such that the substrate is defined by the (100) surface except for a narrow stripe-like region in which the (311)A surface is exposed by etching similarly to the case of the laser diode of FIG. 7. The substrate 90 is incorporated into the metal-organic molecular beam epitaxial growth system of FIG. 1 and is placed on the holder 14 as the substrate 16. Further, the temperature of the substrate 16 is controlled to about 630° C. by the heater 18 and the shutters 29, 30 and 31 are opened. Further, the valve 25d is opened while keeping the valve 25c closed. As a result, Ga, As and Si are introduced into the reaction chamber 10 and a buffer layer 92 of GaAs is grown epitaxially on the substrate 90 to a thickness of about 2 µm. During this step, the vapor pressure of As is maintained at about $1.7 \times 10^{-5}$ Torr and a part 92a of the buffer layer 92 grown on the (100) surface of the substrate 90 is doped to the n-type while a part 92b grown on the (311)A surface is doped to the p-type. Note that the buffer layer part 92a is defined with a (100) top surface and the buffer layer part 92b is defined with a (311)A top surface. In the foregoing step, it should be noted that the buffer layer part 92a and the buffer layer part 92b are grown simultaneously at the time the buffer layer 92 is grown.

Next, the vapor pressure of As is maintained at about $1.7 \times 10^{-5}$ Torr and the valve 25c is opened while maintaining the temperature of the substrate 90 at 630° C. Responsive thereto, a clad layer 94 of GaAlAs having a composition $Al_xGa_{1-x}As$ is grown on the underlying buffer layer 92 to a thickness of about 1.5 µm. As the temperature of the substrate is held at 630° C., the composition of the clad layer 94 is uniform and is represented as $Al_{0.32}Ga_{0.68}As$. Further, as the growth is made at the arsenic vapor pressure of $1.7 \times 10^{-5}$ Torr, it will be understood from FIG. 9 that a part 94a grown on the (100) top surface of the buffer layer part 92a is doped to the n-type while a part 94b of the clad layer 94 grown on the (311)A top surface of the buffer layer part 92b is doped to the p-type. Note that the clad layer part 94a is defined by a (100) top surface and the clad layer part 94b is defined by a (311)A top surface. The clad layer part 94a and the clad layer part 94b are grown simultaneously when the clad layer 94 is grown on the buffer layer 92.

Next, the shutter 28 is opened and Be acting as the p-type dopant is introduced into the reaction chamber 10 while keeping the vapor pressure of arsenic at $1.7 \times 10^{-5}$ Torr. Further, the temperature of the substrate 90 is reduced to 520° C. As a result, an epitaxial layer 96 of GaAlAs having a composition $Al_xGa_{1-x}As$ is grown on the clad layer 94 for a thickness of about 0.1 µm. The epitaxial layer 96 thus grown is doped to the p-type throughout but the composition is different in a region 96a grown on the clad layer part 94a exposing the (100) surface in which the region 96a has a composition of $Al_{0.25}Ga_{0.75}As$ and in a region 96b grown on the clad layer part 96b exposing the (311)A surface in which the region 96b has a composition $Al_{0.1}Ga_{0.9}As$. Similarly to the foregoing embodiment shown in FIG. 7, the region 96a and the region 96b are formed simultaneously when the epitaxial layer 96 is grown and the regions 96a at the both sides of the region 96b act as the optical confinement layer having a low refractive index and the region 96b acts as the active layer having a high refractive index.

Next, the shutter 28 is closed, the vapor pressure of As is increased to about $4.5 \times 10^{-5}$ Torr, and the temperature of the substrate 90 is again increased to about 630° C. Under this condition, another clad layer 98 of p-type GaAlAs having a composition $Al_{0.32}Ga_{0.68}As$ is grown on the epitaxial layer 96 for a thickness of about 1.5 µm irrespective of whether the layer 98 is grown on the region 96a defined with a (100)

top surface or on the region 96b defined with a (311)A top surface as will be understood from the relation shown in FIGS. 2 and 9.

Further, the valve 25c is closed while keeping the temperature of the substrate 90 at 630° C. and maintaining the vapor pressure of As at the foregoing value of $4.5\times10^{-5}$ Torr, and an n-type GaAs cap layer 100 is grown on the clad layer 98 for a thickness of about 1 µm. Responsive to the deposition of the cap layer 100, the stripe-type laser diode is completed.

The laser diode thus constructed has various advantageous features particularly in that the injection of the carrier to the active layer 96b surrounded by clad layers is made preferentially through the clad layer part 94b adjacent to the active layer 96b by concentrating the current to this region. According to the present invention, the laser diode having such a structure can be manufactured without taking the partially completed laser diode out of the epitaxial crystal growth system during the step of manufacturing. As a result, the yield of the laser diode is increased and the cost of the laser diode is decreased.

Further, it should be noted that the source of As is not limited to the foregoing solid arsenic material but a gaseous source material such as metal-organic molecule of As may also be used for supplying As.

Further, the present invention is not limited to the manufacturing of the stripe-type laser diode but is applicable to the manufacturing of any type of semiconductor devices in which a layer of GaAlAs comprising a plurality of sub-regions in which the composition is made different from each other is included.

Further, the present invention for manufacturing the semiconductor devices is applicable in general to epitaxial growth of crystal layers on a substrate as long as the crystal growth is controlled by the decomposition of metal-organic molecules at the surface of the substrate.

The gaseous source material for Al and Ga is not limited to TEA and TEG but other materials such as trimethyl aluminium and triisobutyl aluminium may also be used for the source of Al and trimethyl gallium may also be used for the source of Ga.

Further, the present invention is not limited to these embodiments described heretofore but various variations and modifications may be made without departing from the scope of the invention.

What is claimed is:

1. A method of manufacturing a laser diode, comprising the steps of:

defining a stripe-like region in a first portion of the surface of a substrate of gallium arsenide bounded on opposite edges thereof by a pair of (100) crystal surface portions of the substrate and such that the stripe-like region exposes a selected one of a (311)A crystal surface and a (311)B crystal surface of gallium arsenide;

growing a first epitaxial layer of aluminum gallium arsenide having a composition AlxGa1-xAs with a compositional parameter x set at a first value x1 on the substrate surface by a metal-organic molecular beam epitaxy performed at a first predetermined temperature, said metal-organic molecular beam epitaxy depositing at least aluminum and gallium as a result of decomposition of metal-organic molecules supplied to the vicinity of the substrate, said first epitaxial layer including a first layer portion grown on said stripe-like region of said substrate and a pair of second layer portions grown respectively on the pair of (100) crystal surface portions of said substrate, and respectively sandwiching said first portion therebetween;

growing a second epitaxial layer on the first epitaxial layer, said step of growing the second epitaxial layer including simultaneously growing:

a first layer region of gallium aluminum arsenide, comprising a first portion of the second epitaxial layer and having a composition AlxGa1-xAs with the compositional parameter x set at a second value x2 smaller than said first value x1, on said first layer portion of said first epitaxial layer grown on said stripe-like region of said substrate, by the metal-organic molecular beam epitaxy performed at a second predetermined temperature different from the first predetermined temperature, and a pair of second epitaxial regions of gallium aluminum arsenide, comprising a corresponding pair of second portions of the second epitaxial layer and having the composition AlxGa1-xAs with the compositional parameter x set at a third value x3 larger than said second value x2, respectively on said pair of said second layer portions of said first epitaxial layer such that the first layer region of said second epitaxial layer is sandwiched laterally by said pair of second layer regions of said second epitaxial layer, said step of growing said second layer regions of said second epitaxial layer being performed simultaneously with said step of growing the first layer region of said second epitaxial layer, by the metal-organic molecular beam epitaxy under an identical condition to that of the step of growing the first layer region of said second epitaxial layer; and growing a third epitaxial layer of gallium aluminum arsenide, having a composition identical to the first epitaxial layer on said second epitaxial layer, by performing the metal-organic molecular beam epitaxy at said first predetermined temperature.

2. A method as claimed in claim 1 in which said stripe-like region exposes the (311)B surface, and said second predetermined temperature is set higher than the first predetermined temperature.

3. A method as claimed in claim 2 in which the first predetermined temperature is set to about 520° C. and the second predetermined temperature is set to about 630° C.

4. A method as claimed in claim 1 in which said stripe-like region exposes the (311)A surface, and said second predetermined temperature is set lower than the first predetermined temperature.

5. A method as claimed in claim 1 in which the first predetermined temperature is set to about 630° C. and the second predetermined temperature is set to about 520° C.

6. A method of manufacturing a semiconductor device having an active layer sandwiched by a pair of graded layers, comprising steps of:

exposing a selected one of a (311)A surface and a (311)B surface on a substrate of gallium arsenide;

growing a first graded layer of gallium aluminum arsenide by a metal-organic molecular beam epitaxy while changing the temperature of the substrate;

growing the active layer on the first graded layer; and growing a second graded layer of gallium aluminum arsenide on the active layer by the metal-organic molecular beam epitaxy while changing the temperature of the substrate.

7. A method of growing an epitaxial layer, including therein a plurality of regions having respective conductivity types which are different from each other, epitaxially on a common substrate, comprising the steps of:
  forming at least a first crystal surface and a second crystal surface, which are crystallographically non-equivalent to each other, on the substrate;
  introducing particles comprising constituent elements of the epitaxial layers in the vicinity of the substrate, the particles comprising at least metal-organic molecules containing one of the elements constituting the epitaxial layers;
  decomposing the metal-organic molecules such that the elements therein are released as a result of the decomposition;
  depositing the elements released by the decomposition of the metal-organic molecules onto said first and second crystal surfaces while controlling the vapor pressure of one of the elements at a first pressure level to form a first epitaxial layer covering the substrate including said first and second crystal surfaces, said first epitaxial layer including first and second regions in correspondence to said first and second crystal surfaces, said first and second regions having respective conductivity types determined by said first pressure level; and
  further depositing the elements, released by the decomposition of the metal-organic molecules, onto said first epitaxial layer while controlling the vapor pressure of said one of said elements at a second, different pressure level to form a second epitaxial layer, said second epitaxial layer including first and second regions in correspondence to said first and second regions of the first epitaxial layer, said first and second regions of said second epitaxial layer having respective conductivity types determined by said second pressure level, said second pressure level being set such that the conductivity type of at least one of the first and second regions of the second epitaxial layer is different from that of the corresponding region of the first epitaxial layer, the step of depositing being performed such that the growth of the first and second epitaxial layers is controlled by the decomposition of the metal-organic molecules.

8. A method of manufacturing a laser diode, comprising the steps of:
  defining a stripe-like region in a part of a substrate of gallium arsenide bounded by a (100) surface such that the stripe-like region exposes a (311)A surface of gallium arsenide;
  growing a first semiconductor layer comprising a first buffer region and a pair of second buffer regions, said step of growing the first semiconductor layer comprising the simultaneous steps of:
    growing said first buffer region of p-type gallium arsenide on said stripe-like region of the substrate by performing a first metal-organic molecular beam epitaxy for depositing at least gallium, arsenic and an n-type dopant under a vapor pressure of arsenic set at a first predetermined level, and
    growing said pair of second buffer regions of n-type gallium arsenide on corresponding, remaining parts of the substrate excluding the stripe-like region such that the second buffer regions sandwich the first buffer region laterally in the first semiconductor layer, said step of growing said pair of second buffer regions being performed simultaneously with the step of growing the first buffer region by performing the first metal-organic molecular beam epitaxy under an identical condition to that of the step of growing the first buffer region;
  growing a second semiconductor layer comprising a first clad region and a pair of second clad regions, said step of growing the second semiconductor layer comprising the simultaneous steps of:
    growing said first clad region of p-type gallium aluminum arsenide having a composition $Al_xGa_{1-x}As$ with a compositional parameter x at a first value x1 on the first semiconductor layer in correspondence to the first buffer region by performing a second metal-organic molecular beam epitaxy for depositing aluminum, gallium, arsenic and an n-type dopant while setting the vapor pressure of arsenic to the first predetermined level,
    growing said pair of second clad regions of n-type gallium aluminum arsenide having a composition identical to said first clad region on said first semiconductor layer in correspondence to the second buffer regions such that said second clad regions sandwich said first clad region laterally in said second semiconductor layer, said step of growing the second clad regions being performed simultaneously with the step of growing the first clad region by performing the second metal-organic molecular beam epitaxy under an identical condition to that of the step of growing the first clad region;
  growing a third semiconductor layer comprising an active region and a pair of third clad regions on said second semiconductor layer, said step of growing said third semiconductor layer comprising the simultaneous steps of:
    growing said active region of p-type gallium aluminum arsenide having a composition $Al_xGa_{1-x}As$ with the compositional parameter x at a second value x2 smaller than said first value x1 on said first clad region by performing said second metal-organic molecular beam epitaxy,
    growing said pair of third clad regions of p-type gallium aluminum arsenide having a composition $Al_xGa_{1-x}As$ with the compositional parameter set to a third value x3 which is larger than the second value x2 on said pair of second clad regions, respectively, such that said third clad regions sandwich said active region laterally in said third semiconductor layer, said step of growing said third clad regions being performed simultaneously with said step of growing said active region by performing said second metal-organic molecular beam epitaxy under a condition identical to said step of growing said active region; and
  growing a fourth semiconductor layer of n-type gallium aluminum arsenide having a composition identical to that of said first clad region so as to cover said active layer and said third clad regions by performing said second metal-organic molecular beam epitaxy while setting the vapor pressure of arsenic to a second predetermined level.

9. A method as claimed in claim 8 in which said step of growing said active region is performed under the vapor pressure of arsenic set to the first predetermined level.

10. A method as claimed in claim 8 in which said steps of growing said first and second buffer regions, said first and second clad regions, and said fourth semiconductor layer are preformed at a first predetermined temperature while said steps of growing said active region and said third clad regions are performed at a second predetermined temperature lower than the first predetermined temperature.

11. A method of growing a semiconductor layer epitaxially on a common substrate, said epitaxial layer including therein a plurality of regions having respective compositions and conductivity types which are different from each other, said method comprising the steps of:

forming at least a first crystal surface and a second crystal surface, which are crystallographically nonequivalent to each other, on said substrate;

introducing particles comprising constituent elements of the epitaxial layers in the vicinity of the substrate, the particles comprising at least metal-organic molecules containing one of the constituent elements of the epitaxial layers;

decomposing the metal-organic molecules such that the elements therein are released as a result of the decomposition; and depositing the elements released by the decomposition of the metal-organic molecules onto said first and second crystal surfaces while controlling the temperature of the substrate and the vapor pressure of one of the released elements respectively at a first temperature and a first vapor pressure to form a first epitaxial layer, said first epitaxial layer having a first region corresponding to said first crystal surface and a second region corresponding to said second crystal surface, said first region and said second region of said first epitaxial layer having respective compositions and conductivity types determined by said first temperature and first vapor pressure;

further depositing the elements released by the decomposition of the metal-organic molecules onto said first epitaxial layer while controlling the temperature of the substrate and the vapor pressure of said one element respectively at a second temperature and a second vapor pressure to form a second epitaxial layer, said second epitaxial layer having a first region corresponding to said first region of the first epitaxial layer and a second region corresponding to said second region of the first epitaxial layer, said first and second regions of said second epitaxial layer having respective compositions and conductivity types determined by said second temperature and said second vapor pressure, said second temperature and second vapor pressure being chosen such that both the composition and the conductivity type of at least one of the first and second regions of the second epitaxial layer are different from those of the corresponding region of the first epitaxial layer, the steps of depositing and further depositing both being performed such that the growth of each of the respective first and second epitaxial layers is controlled by the decomposition of the metal-organic molecules.

12. A method of controlling the respective compositions of gallium aluminum arsenide layers grown epitaxially and in succession on a selected crystal surface of a gallium arsenide substrate, comprising the steps of:

selecting one of a (311)A crystal surface and a (311)B crystal surface of the gallium arsenide substrate as the selected crystal surface thereof;

introducing particles comprising at least metal-organic molecules containing aluminum and gallium, constituent elements of the gallium aluminum arsenide layers to be epitaxially grown, in the vicinity of the substrate;

decomposing the metal-organic molecules of said particles such that aluminum and gallium elements therein are released as a result of the decomposition;

depositing the released aluminum and gallium elements on the selected crystal surface of the substrate; and controlling the temperature of the substrate during the step of depositing in accordance with:

defining, relatively to the selected crystal surface of the substrate, a first temperature at which the released and deposited aluminum and gallium elements form an epitaxial layer of a first composition and a second temperature, different from that the first temperature, at which the released and deposited aluminum and gallium elements form an epitaxial layer of a second composition, different from the first composition, setting the temperature of the substrate to the first temperature for a first time duration of the depositing step thereby to form a first epitaxial layer having the first composition, and setting the temperature of the substrate to the second temperature for a second time duration of the depositing step thereby to form a second epitaxial layer having the second composition.

13. A method as recited in claim 12, wherein the proportionate content, of at least one of the gallium and aluminum constituent elements, of the first composition is different from that of the second composition.

14. A method as recited in claim 12, wherein the first epitaxial layer having the first composition comprises an active region of a stripe-type laser diode and the second epitaxial layer of the second composition comprises a clad layer, relatively to the active region of the first epitaxial layer.

15. A method of growing an epitaxial layer, including therein first and second regions having respective and different first and second compositions, epitaxially on a common substrate, comprising the steps of:

forming at least a first crystal surface and a second crystal surface, which are crystallographically non-equivalent to each other, on said substrate;

introducing particles comprising constituent elements of the epitaxial layer in the vicinity of the substrate, the particles comprising at least metal-organic molecules containing one of the elements constituting the epitaxial layer and the composition of the epitaxial layer comprising first and second elements of the same group of the periodic table;

decomposing the metal-organic molecules such that the constituent elements therein are released as a result of the decomposition; and depositing the elements released by the decomposition of the metal-organic molecules onto said first and second crystal surfaces to form said epitaxial layer, said epitaxial layer having first and second regions respectively corresponding to said first and second crystal surfaces, said step of deposition further comprising:

defining a first temperature of the substrate at which the released and deposited elements form an epitaxial layer on the substrate having a first, common composition in the first and second regions thereof and, further, defining a second temperature of the substrate at which the released and deposited elements form an epitaxial layer on the substrate in which the first and second regions of the epitaxial layer have the respective and different first and second compositions, the ratio of the proportionate content of the first and second elements of the same group of the periodic table being different in the first composition from that in the second composition, and controlling the substrate to the second temperature so that the first and second regions of the epitaxial layer, as formed on the first and second crystal surfaces of the substrate, have the respective and different first and second compositions, the step of depositing being performed such that the growth of the epitaxial layer is controlled by the decomposition of the metal-organic molecules.

16. The method as recited in claim 15, wherein the second region of the epitaxial layer is an active region of a stripe laser diode and the first region of the epitaxial layer is a clad region bounding the second, active region.

17. A method as recited in claim 15, further comprising:

performing the depositing step for a first time interval while controlling the substrate to the second temperature thereby to form the epitaxial layer having the first and second regions, of respective and different first and second compositions, as a first epitaxial layer; and performing the depositing step for a second time interval at the second temperature thereby to form a second epitaxial layer, having the first composition commonly in the first and second regions thereof, on the first epitaxial layer.

18. A method as recited in claim 17, wherein the second region of the first epitaxial layer is an active region of a stripe laser diode and the first region of the first epitaxial layer and the second epitaxial layer comprise clad regions bounding the active region.

19. A method of controlling the respective conductivity types of gallium aluminum arsenide layers grown epitaxially and in succession on a selected, exposed surface of a gallium arsenide substrate, comprising the steps of:

providing a selected crystal surface of the substrate which will support the growth thereon of an epitaxial layer;

introducing particles comprising constituent elements of the epitaxial layers in the vicinity of the substrate, said particles comprising at least metal-organic molecules containing one of the elements constituting each of the epitaxial layers;

introducing molecules of a common dopant of the epitaxial layers in the vicinity of the substrate;

decomposing the metal-organic molecules such that the constituent elements therein are released as a result of the decomposition; and depositing the elements released by the decomposition of the metal-organic molecules and the common dopant onto the selected crystal surface of the substrate, said step of depositing further comprising:

defining first and second different vapor pressures of a first element, of the constituent elements, at which the released constituent elements, as deposited with the common dopant onto the selected crystal surface of the substrate, form corresponding first and second epitaxial layers on the selected crystal surface of the substrate of respective and different first and second conductivity types, selectively controlling the vapor pressure of the first element to the first pressure level for a first time duration of the depositing step so as to produce, as an epitaxial layer grown on the selected crystal surface, the first epitaxial layer doped with said common dopant and having the first conductivity type, and selectively controlling the vapor pressure of the first element to the second pressure level for a second time duration of the depositing step so as to produce, as an epitaxial layer grown on the first epitaxial layer, the second epitaxial layer doped with said dopant and having the second conductivity type.

20. A method of growing, on a substrate, an epitaxial layer having a selectively controlled conductivity type, comprising the steps of:

selecting a crystal surface of the substrate which will support the growth thereon of an epitaxial layer;

introducing particles comprising constituent elements of the epitaxial layer in the vicinity of the substrate, said particles comprising at least metal-organic molecules containing one of the elements constituting the epitaxial layer;

decomposing the metal-organic molecules such that the elements therein are released as a result of the decomposition; and depositing the elements released by the decomposition of the metal-organic molecules onto the selected crystal surface of the substrate, said step of depositing further comprising selectively controlling the vapor pressure of a selected one of the first elements so as to produce a desired one of first and second, opposite conductivity types of the epitaxial layer as grown on the selected crystal surface, said step of selectively controlling the vapor pressure further comprising:

defining, for the crystal surface, corresponding first and second vapor pressures in accordance with which the epitaxial layer as grown on the selected crystal surface is of the desired one of the first and second conductivity types, and during the step of depositing and for the desired one of the first and second different conductivity types of the epitaxial layer to be deposited on the selected crystal surface, maintaining the vapor pressure of the selected one of the elements at the corresponding one of the first and second vapor pressures.

* * * * *

UNITED STATES PATENT AND TRADEMARK OFFICE
CERTIFICATE OF CORRECTION

PATENT NO. : 5,476,811
DATED : Dec. 19, 1995
INVENTOR(S) : FUJII et al.

It is certified that error appears in the above-indentified patent and that said Letters Patent is hereby corrected as shown below:

Col. 8, line 15, change "620°60C" to --620°C--.

Col. 9, line 3, change "Ga0.68" to --$Ga_{0.68}$--.

Col. 10, line 13, change "$5 \times 10^{19}$" to --$5 \times 10^{17}$--.

Signed and Sealed this

Twenty-third Day of July, 1996

Attest:

BRUCE LEHMAN

Attesting Officer     Commissioner of Patents and Trademarks